United States Patent [19]

Takahashi

[11] Patent Number: 5,119,217

[45] Date of Patent: Jun. 2, 1992

[54] ACTIVE MATRIX SUBSTRATE FOR LIQUID CRYSTAL DEVICE

[75] Inventor: Kotoyoshi Takahashi, Suwa, Japan

[73] Assignee: Seiko Epson Corporation, Tokyo, Japan

[21] Appl. No.: 525,557

[22] Filed: May 18, 1990

[30] Foreign Application Priority Data

May 18, 1989 [JP] Japan .................................. 1-124718

[51] Int. Cl.⁵ .................................................. G02F 1/13
[52] U.S. Cl. .................................... 359/54; 359/57; 359/58; 359/57; 359/88; 340/784
[58] Field of Search ................. 357/23.7, 4, 71; 350/333, 334, 336; 359/54, 57, 58, 87, 88; 340/784 C

[56] References Cited

U.S. PATENT DOCUMENTS

| 4,523,811 | 6/1985 | Ota | 350/333 |
| 4,534,623 | 8/1985 | Araki | 350/334 |
| 4,683,183 | 7/1987 | Ono | 350/334 |
| 4,787,712 | 11/1988 | Ukai et al. | 350/336 |
| 4,861,141 | 8/1989 | Nakazawa | 350/334 |
| 4,929,059 | 5/1990 | Takahashi | 350/334 |

Primary Examiner—Rolf Hille
Assistant Examiner—Minhloan Tran
Attorney, Agent, or Firm—Blum Kaplan

[57] ABSTRACT

An active matrix substrate including a matrix of picture elements arranged in columns and rows with each picture element having an associated non-linear element is provided. Interpixel connections between the non-linear elements and row electrode include an equivalent capacitor. The capacitor is formed by depositing a second metal film of low resistance on the row electrode. This forms a large area MIM of the first metal row electrode, insulating film and second metal film. Signals are applied to the second metal film.

12 Claims, 6 Drawing Sheets

ACTIVE MATRIX SUBSTRATE FOR LIQUID CRYSTAL DEVICE

BACKGROUND OF THE INVENTION

This invention relates to a liquid crystal display device, and in particular, to a liquid crystal display device including an active matrix utilizing an MIM (metal-insulator-metal) element as a switching element.

A typical liquid crystal display device includes liquid crystal material between two substrates in which one substrate contains multiple picture elements. Each picture element is connected to a nonlinear element with two terminals. Typical nonlinear elements are those including inorganic films, such as in MIM elements, MSI (metal semi-insulator) elements, ring diodes, back-to-back diodes, varistors, and the like, or may include organic films such as polyimide. A typical nonlinear element is the MIM element which functions as a switching element to permit voltage retention. Each picture element is connected via its MIM element to its neighbor picture element by an interpixel connection.

A conventional liquid crystal display including a plurality of picture elements in a matrix on a substrate are each connected to an electrode by an MIM element as shown in FIGS. 1 and 2. A plurality of MIM elements 9 in a matrix on an insulating substrate 1 and the structure of MIM element 9 are shown. MIM element 9 includes a first metal film 2 on insulating substrate 1. First metal film 2 is used as a lead and as a terminal portion 3 for making contact with an external driving circuit and is formed with a plurality of projecting portions 4. An insulating film 6 is formed on the surface of metal film 2 except along terminal portion 3. A second metal film 7 is formed on insulating film 6 intersecting projecting portion 4 of first metal film 2. The intersection of first metal film projecting portion 4 and second metal film 7 with insulating film 6 therebetween creates a MIM element. A transparent picture cell electrode 8 is deposited on substrate 1 and connected electrically as a series with second metal film 7 of MIM element 9.

FIG. 3 shows the terminal area and first pixel of the type of device shown in FIGS. 1 and 2. FIG. 4 is a cross-sectional view taken along line 4—4 of FIG. 3. In this type of device, a picture element electrode 15 and MIM element 18 are located on the first position of interpixel connection 17. The structure shown in FIGS. 1 and 2 is formed as follows. A first metal film, typically tantalum (Ta), is formed on substrate 10 and photoetched to a desired shape such as parallel electrode lines 11. Ta first metal layer 11 is then oxidized by anodic or thermal oxidation to form a thin layer of tantalum oxide ($TaO_x$) insulation layer 13, where x is any number which forms a stable oxide of Ta, overlapping Ta layer 11. A terminal area 16 is formed by removing the $TaO_x$ layer, leaving Ta layer 11 exposed at terminal area 16.

Interpixel connection 17 includes a projection 25 extending perpendicularly from Ta layer 11 at each pixel area. A second metal layer 14 of chromium (Cr) is formed and photoetched across projecting region 25 of Ta and $TaO_x$. The intersection of Cr second metal layer 14, $TaO_x$ layer 13 and Ta layer 11 forms a non-linear element, or MIM element 18. Finally, a picture element electrode 15 is formed by depositing a transparent picture cell electrode material and photoetching to form a picture element electrode 15 overlapping end portions of Cr layer 14.

In the example shown in FIGS. 3 and 4, three intricate photoetching steps occur, namely the photoetching of Ta layer 11, Cr layer 14, and picture element electrode 15. Although the formation of terminal area 16 also involves photoetching, it does not require the accuracy to form the interpixel connection and is more easily accomplished than the other three photoetchings.

Signals reach picture element electrode 15 as follows. A signal is input to Ta layer 11 at terminal area 16 and travels along Ta layer 11 to interpixel connection 17. The signal reaches projection 25 and MIM element 18 and is then carried through $TaO_x$ film to Cr layer 14 and finally to picture element electrode 15. At the same time, the signal continues to travel along Ta layer 11 to reach additional picture elements and the respective MIM elements in the row.

A diagram of an equivalent circuit for the connection between terminal 16 and picture element electrode 15 is shown in FIG. 5. Distribution resistance (R) 21 indicates the distribution resistance of interpixel connection 17 which substantially equals the distribution resistance of Ta layer 11, since $TaO_x$ 13 is an insulator. MIM element 18 is the equivalent of capacitor $C_m$ and resistance $r_m$ connected in parallel and are indicated as numeral 19. Distribution resistance 21 and MIM 19 are connected in series with a picture element 20.

In view of this, the resistance of interpixel connection 17 depends only on the resistance of Ta layer 11, since $TaO_x$ layer 13 is an insulator. Since the resistance of interpixel connection 17 reduces the voltage of the signals input at terminal area 16, a voltage difference arises. Likewise, the voltage which reaches between a picture element close to terminal 16 and a picture element further away from terminal area 16 varies when the picture elements are displayed. In other words, unevenness of the display is caused. In order to improve picture quality of a liquid crystal display device of this type, it is necessary to reduce the resistance of interpixel connection 17.

Several methods have been suggested for reducing the resistance of interpixel connection 17 to improve the picture quality of the resulting liquid crystal display device. It has been suggested to enlarge the patterned width of Ta layer 11 at interpixel connection 17 or by increasing the thickness of Ta layer 11. The first suggestion is less than satisfactory, because the increased width of the interpixel connection reduces the density or picture elements which in turn reduces the picture quality. The latter suggestion not only adversely affects pattern accuracy at time of forming Ta layer 11, but also has a negative impact on forming the stepped chromium photoetching at the edges of the $TaO_x$ layer. Accordingly, it has been difficult to reduce the distribution resistance at the interpixel connection. This has led to propose a structure of interpixel connection 17 shown in FIGS. 6-8. The portion of the substrate of the liquid crystal display device shown in FIG. 6 corresponds to the same portion of the substrate in FIG. 3. This includes terminal area 16 and first picture element electrode 15 with interpixel connection 17. FIG. 7 is a cross-sectional view of line 7—7 of FIG. 3. FIG. 8 is a cross-sectional view along line 8—8 of FIG. 6. FIGS. 8a-8d show the steps of manufacturing the apparatus shown in FIG. 8e.

Ta layer 11 is formed and photoetched on substrate 10 and oxidized to form $TaO_x$ layer 13. A channel 23 is etched through the center of $TaO_x$ layer 13 to expose a portion of Ta layer 11. Channel 23 is filled with a second metal layer, such as Cr layer 12 which is coated and photoetched at the same time as Cr layer 14. After this, picture element 15 can also be formed and photoetched as in the earlier examples.

The resistivity of chromium is approximately 30 micro-ohm-cm, much less than the approximately 220 micro-ohm-cm of tantalum. Thus, the resistivity of interpixel connection 17 which includes both Ta layer 11 and Cr layer 12 is considerably less than the resistivity of an interpixel connection without Cr layer 12. Additionally, the thickness of Cr layer 12 may be increased as desired for optimum consistency in the voltage applied to the different picture elements along Ta layer electrode 11.

A liquid crystal display device formed from a substrate as shown in FIGS. 6-8 has two disadvantages. First, the additional photoetching step shown in FIG. 8c, as well as the photoetching of Cr layer 12, increases the number of photoetching steps to four, and thus the production cost by at least one-third. Further, during the additional photoetching step of FIG. 8c, a portion of $TaO_x$ layer 13 of MIM element 18 is exposed to the photoetching process which results in a higher incidence of imperfections in the insulation layer of the MIM device and thus a decreased yield of substrates during production.

Accordingly, it is desirable to provide an active substrate for a liquid crystal display device capable of improved contrast between picture elements by lowering the resistivity of interpixel connections without an increase of production costs or reduced yields.

SUMMARY OF THE INVENTION

Generally speaking, in accordance with the invention, an active matrix panel including a matrix of picture element electrodes coupled to electrode lines by associated non-linear elements with an equivalent and a capacitor arranged in series between the electrode line and each non-linear element. The equivalent capacitor is formed by depositing a first metal layer on a substrate to form electrode lines with perpendicular projecting region for connecting to associated picture element electrodes. The first metal layer is oxidized to form a highly resistant insulating film thereon. A second metal layer is deposited on the highly resistant insulating film. Signals for driving a display including the substrate are applied to the second metal layer in the terminal region, travel along the second metal layer and then pass through the insulating film to the first metal layer and then travel to the non-linear MIM element to contact the picture element electrode.

Accordingly, it is an object of the invention to provide an improved active matrix substrate for a liquid crystal display device.

Another object of the invention is to provide a liquid crystal display device utilizing an active matrix substrate which has improved contrast.

A further object of the invention is to provide a liquid crystal display device including an active matrix substrate in which picture elements farther from the terminal voltage input received approximately the same voltage as picture elements near the voltage input.

Yet another object of the invention is to provide an active matrix substrate for a liquid crystal display device in which the resistance of the interpixel connection is low.

Still another object of the invention is to provide an improved active matrix substrate for a liquid crystal display device which is inexpensive to produce.

Still a further object of the invention is to provide an improved active matrix substrate for a crystal display device which has a high yield during manufacture.

Still other object and advantages of the invention will in part the obvious and will in part the apparent from the specification.

The invention accordingly comprises the several steps and the relation of one or more of such steps with respect to each of the others, and the article possessing the features, properties, and the relation of elements which are exemplified in the following detailed disclosure, and the scope of the invention will be indicated in claims.

BRIEF DESCRIPTION OF THE DRAWINGS

For a fuller understanding of the invention, difference is had to the following description taken in connection with the accompanying drawings, in which.

DESCRIPTION OF THE PREFERRED EMBODIMENT

Figure 9:
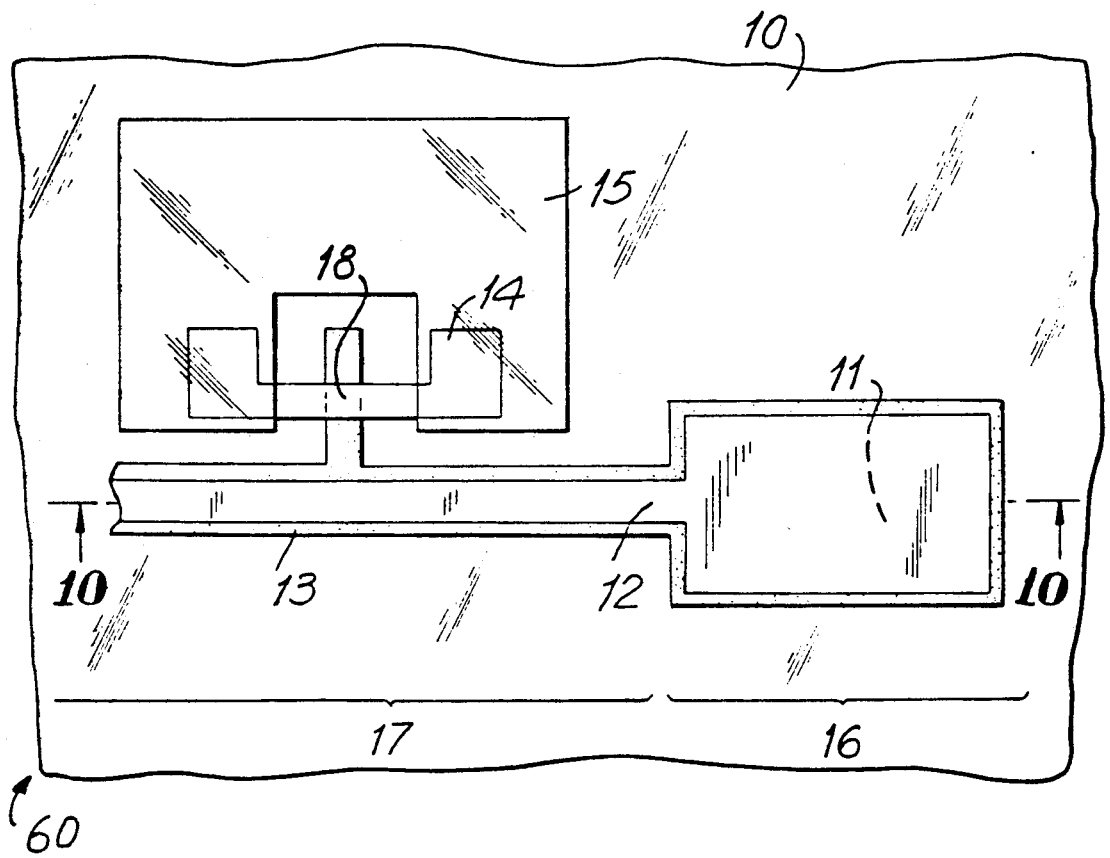
FIG. 9 is a top plan view of a picture element, MIM element, interpixel connection and terminal area prepared in accordance with the invention.
Figure 10:
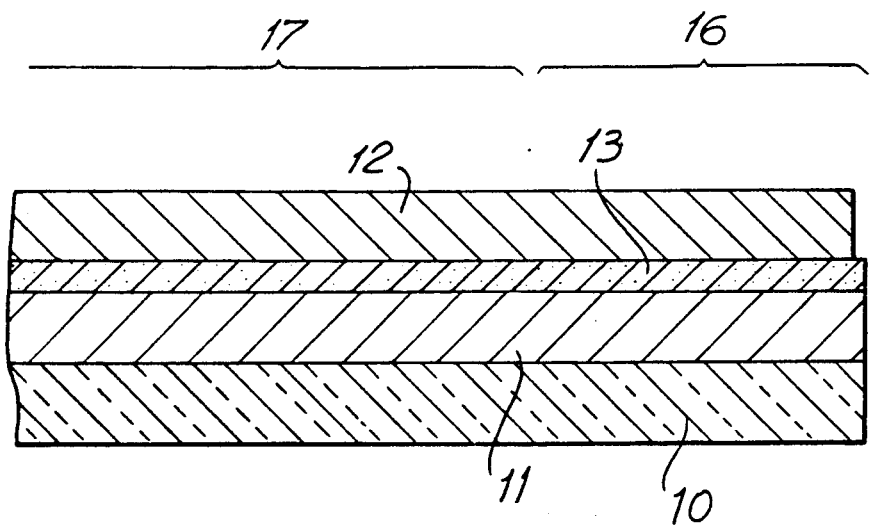
FIG. 10 is a sectional view taken along line 10—10 of FIG. 9.

FIGS. 9 and 10 show a portion of an active matrix substrate 60 of a liquid crystal display device constructed and arranged in accordance with the invention. Ta first metal layer 11 is formed and photoetched on substrate 10. Metals other than Ta may be used. Ta layer 11 is oxidized by anodic oxidation or thermal oxidation to form a thin film of $TaO_x$ insulating layer 13, where x is any number which forms a stable oxide of Ta. If a metal other than tantalum is used for layer 11, then layer 13 would be an oxide insulator of that metal.

Figure 1:
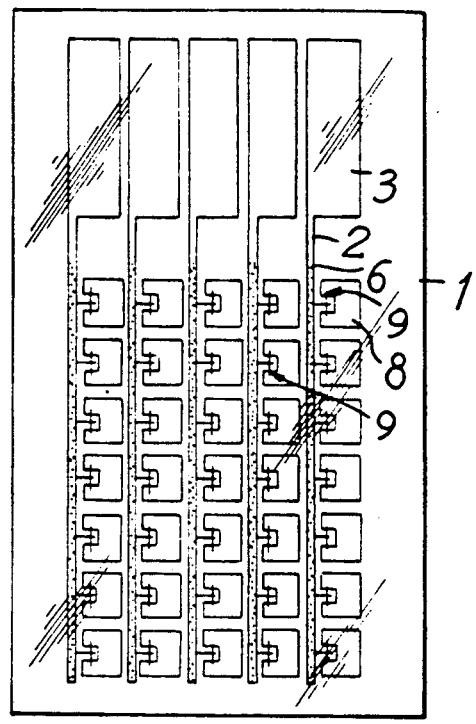
FIG. 1 is a schematic view of a portion of an active matrix utilizing MIM elements.
Figure 2:
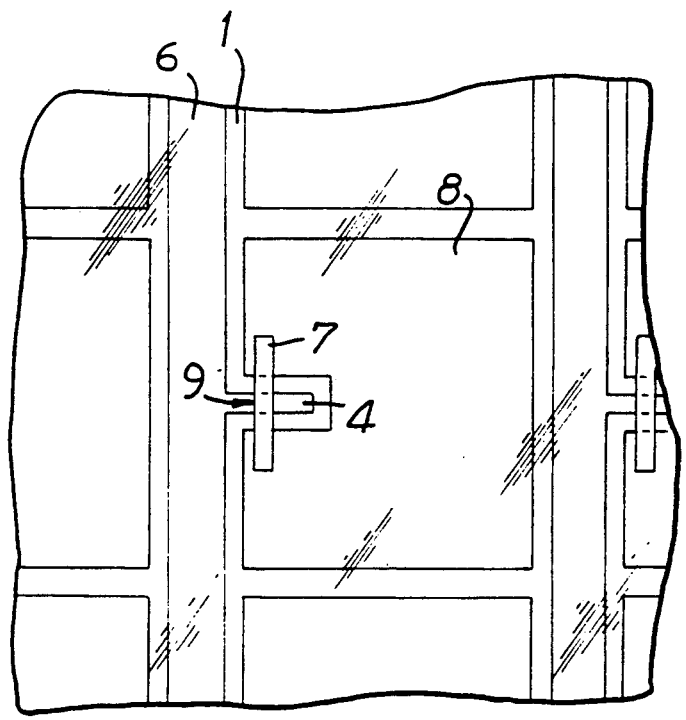
FIG. 2 is an enlarged view of a portion of the matrix of FIG. 1.
Figure 3:
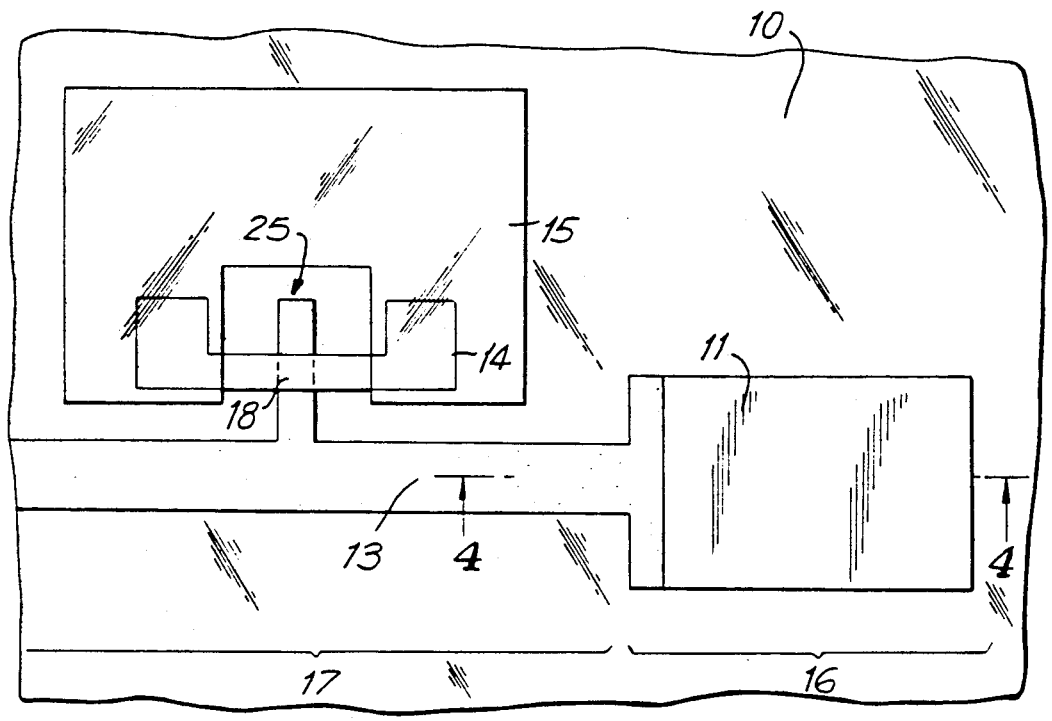
FIG. 3 is top plan view of a conventional picture element, MIM element, interpixel connection and terminal area.
Figure 6:
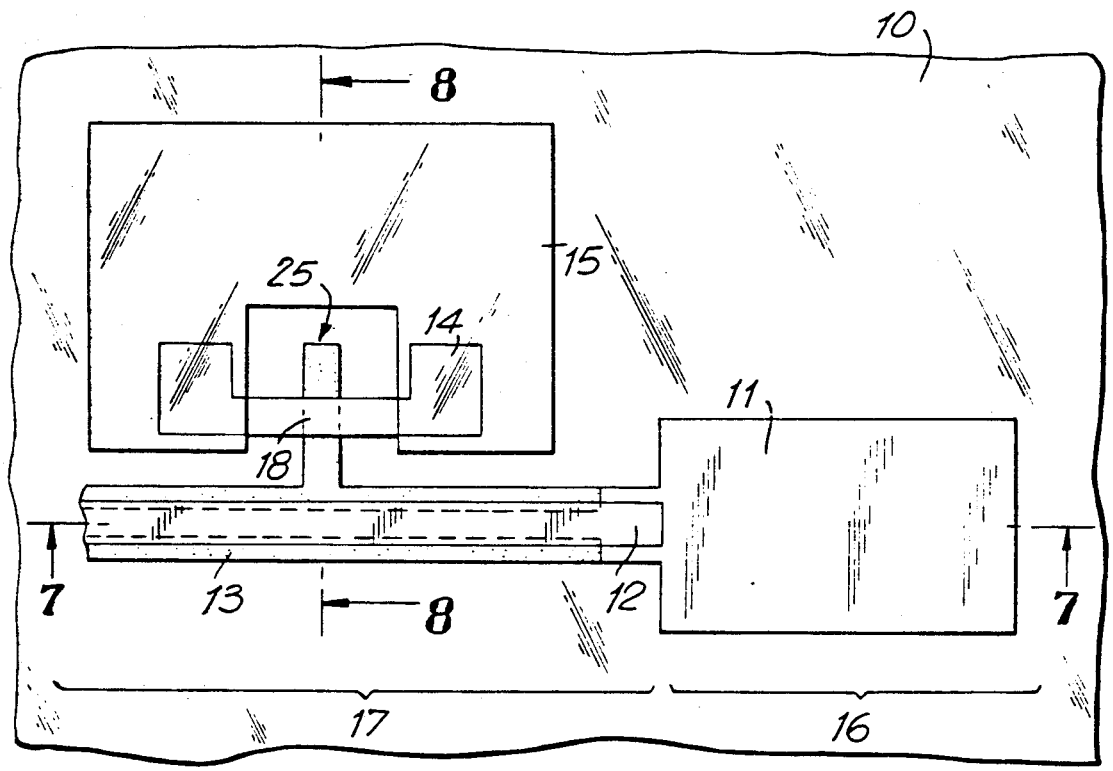
FIG. 6 is a top plan view of another conventional picture element, MIM element, interpixel connection and terminal area.

The method of manufacturing active matrix substrate 60 is the same as shown in the prior art examples in FIGS. 3 and 6. However, in the example of FIG. 3, $TaO_x$ is removed from terminal area 16 and, in FIG. 6, channel 23 was formed along $TaO_x$ layer 13. It is not necessary to perform these photoetching steps. Instead, at the same time Cr layer 14 of MIM element 18 is formed, Cr layer 12 is also formed and photoetched on $TaO_x$ film 13 along interpixel connection 17 and terminal area 16 as shown in FIG. 9. It is possible to use other metals with low resistivity in place of Cr layer 12. Ideally, the metal which is used for layer 12 is the same as used in second metal layer 14 of MIM element 18 so that the patterning and photoetching of the two layers may be accomplished at the same time.

Examples of other materials than Ta and Cr for the MIM element include aluminum (Al), gold (Au), Indium Tin Oxide (ITO), NiCr with Au, and ITO with Cr. The insulation film may be $SiO_x$, $SiN_y$, $SiO_xN_y$, $TaN_y$ and $ZnO_x$ where x is any number which forms a stable oxide and y is any number which forms a stable nitride. Additionally, it is to be noted that MIM element 18 may be any nonlinear element. Finally, picture element electrode 15 is patterned and photoetched contacting Cr layer 14 as is done conventionally.

Signals are input to Cr layer 12 in terminal area 16. These signals are applied to pixel electrode 15 after passing through $TaO_x$ insulating layer 13 in interpixel connection 17 and through non-linear MIM element 18. Since $TaO_x$ layer 13 is an insulating film, it is a highly resistant insulator. Therefore, the signal can not be supplied to MIM element 18 unless it passes through $TaO_x$ insulating layer 13 even though Cr layer 12 is highly conductive.

Interpixel connection 17 including connecting Cr layer 12, $TaO_x$ insulating layer 13 and Ta electrode line 11 has the same cross-sectional structure as MIM element 18. Interpixel connection 17 is of considerably larger surface area than MIM element 18 of Ta layer 11, $TaO_x$ layer 13 and Cr layer 14. Thus, the signal applied to terminal area 16 is transmitted from the larger area MIM into the smaller MIM of each picture element.

Figure 11:
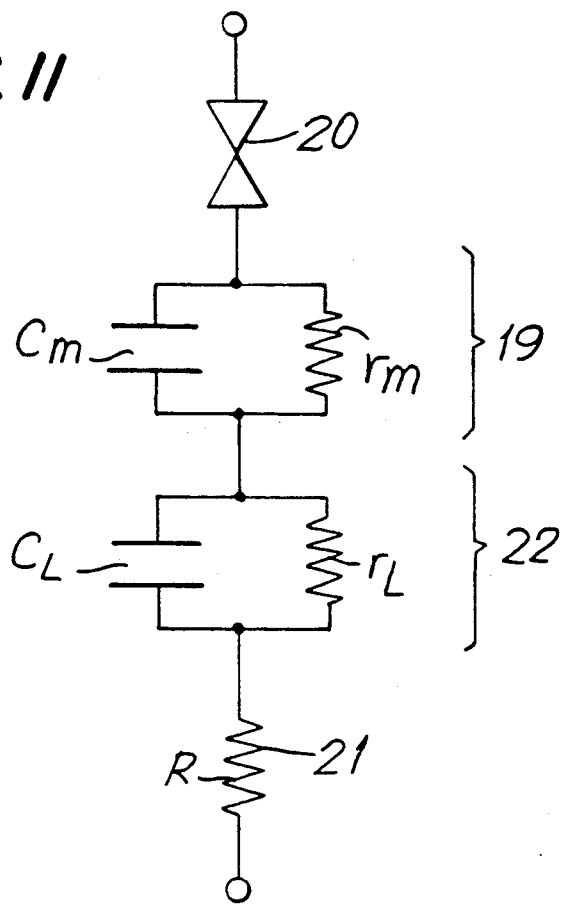
FIG. 11 is a circuit diagram of the apparatus of FIG. 9.

The benefits of a liquid crystal display device including an active matrix substrate arranged in accordance with the invention is shown in FIG. 11 which illustrates an equivalent circuit. Distribution resistance 11(R) is the distribution resistance of interpixel connection 17 of FIG. 9. R is substantially the resistance of Cr connecting layer 12. Connecting MIM element of Cr layer 12 is the large area MIM of Ta layer 11, $TaO_x$ layer 13 and connecting Cr layer 12.

Figure 5:
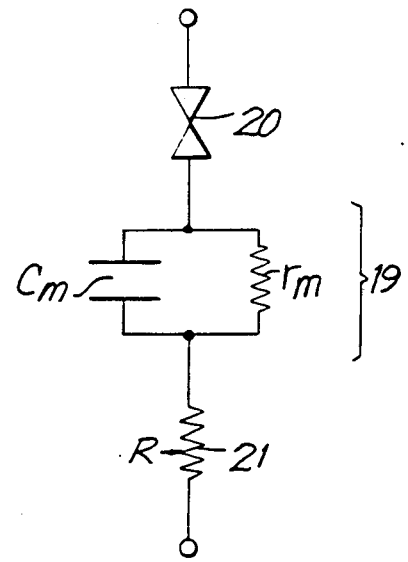
FIG. 5 is a circuit diagram of the apparatus shown in FIG. 3.

The resistance of liquid crystal 20 of picture element 15 is the same as in the circuit diagram of FIG. 5. Capacitance $c_m$ and resistance $r_m$ of MIM element 18 are in parallel and shown as element 19 as the equivalent circuit diagram FIG. 5. An additional element 22 appears in series, because of the large area MIM formed in interpixel connection 17, with a capacity $C_L$ and resistance $r_L$ connected in parallel. However, the resistance of larger MIM element of interpixel connection 17 is very small compared with the resistance of MIM element 18. Also, the capacitance of large MIM element of interpixel connection 17 is very large compared to the capacitance of MIM element 18. If the composite resistance and capacitance of the two MIM elements is $R_o$ and $C_o$, respectively, and given that elements 19 and 22 are connected in series, then the following relationships can be established:

$$r_m >> r_L$$
$$C_m << C_L$$
$$R_o = r_m + r_L$$
$$= r_m(1 + r_L/r_m)$$
$$\approx r_m; \text{ and}$$
$$C_o = 1/(1/C_m + 1/C_L)$$
$$= C_m/(1 + C_m/C_L)$$
$$\approx C_m.$$

Accordingly, based on these electrical properties, connection MIM element can be ignored compared to MIM element 18. Since the resistance and capacitance of both MIM elements is equivalent to the resistance and capacitance of MIM element 18, a liquid crystal display having an interpixel connection with low resistance using Cr layer 12 is obtained.

Figure 4:
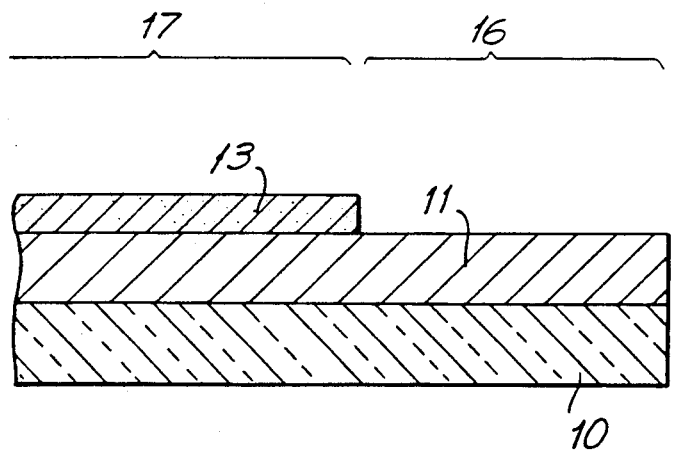
FIG. 4 is a sectional view taken along line 4—4 of FIG. 1.
Figure 7:
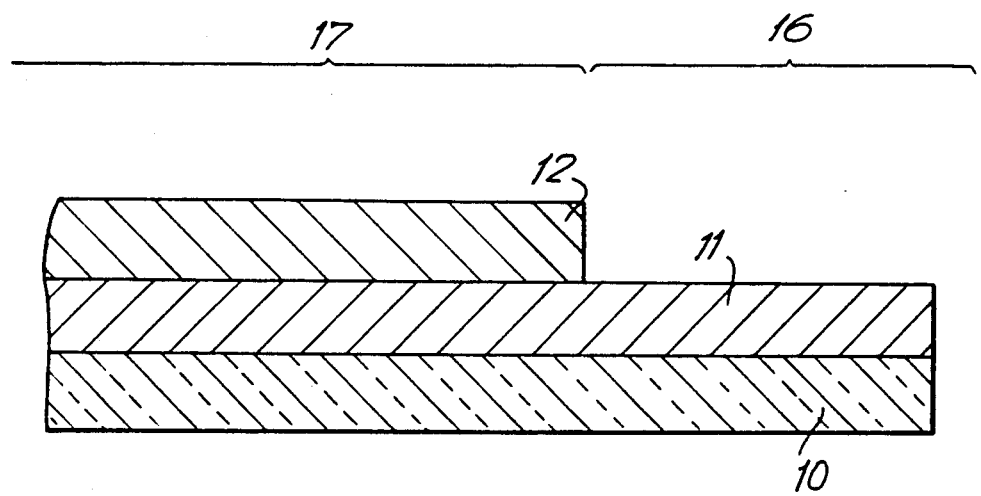
FIG. 7 is a sectional view taken along line 7—7 of FIG. 6.
Figure 8A:
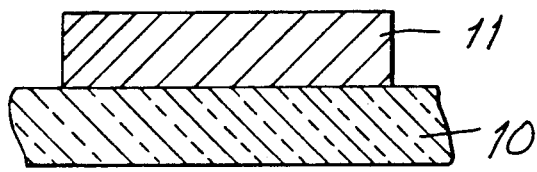
FIGS. 8a-8e illustrate the steps to prepare the apparatus shown in FIG. 6, with the final step, FIG. 8e, corresponding to a sectional view taken along line 8—8 of FIG. 6.
Figure 8B:
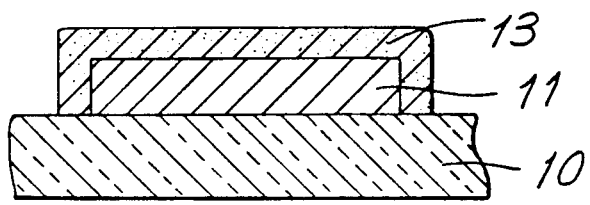
Figure 8C:
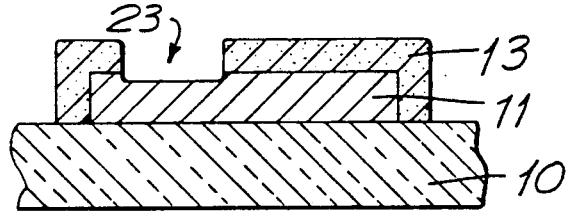
Figure 8D:
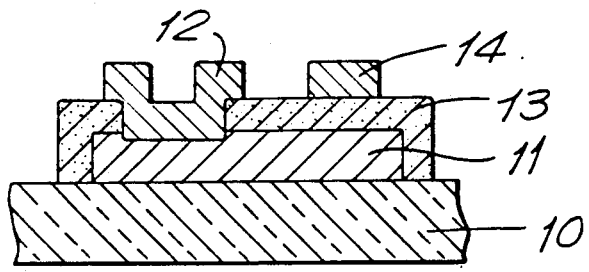
Figure 8E:
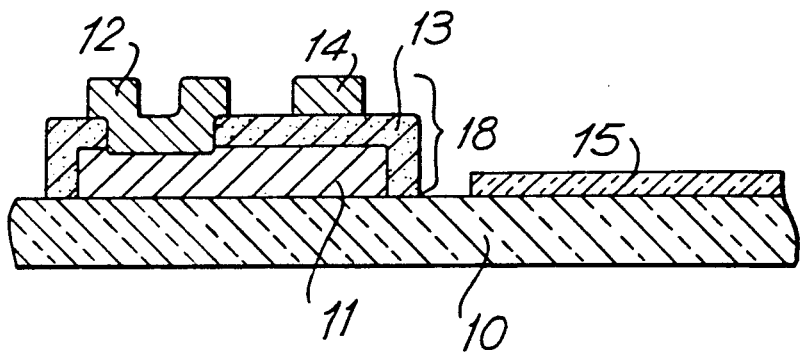

Comparing a liquid crystal display device formed in accordance with the invention to those shown in FIGS. 3-5, the resistance of interpixel connection 17 has been greatly reduced. Therefore, the picture quality and contrast of the liquid crystal display device formed in accordance with the invention will be considerably improved over the devices of FIGS. 3-5. Additionally, fewer photoetching steps are involved in the manufacture of the device in accordance with the invention. This includes one for forming Ta layer 11, one for forming Cr layer 14 or connection Cr layer 12, and one for forming pixel electrode 15. Thus, only a total of three photoetching steps are necessary leading to a device which costs less to produce and has a higher yield than the devices shown in FIGS. 6-8. The three photoetching steps are less than necessary to prepare the device of FIG. 6 which is a total of four so that costs are reduced to three-fourths. Further, the surface of the $TaO_x$ of MIM element 18 is not exposed to the photoetching process, leading to fewer defects and higher production yields.

Figure 12:
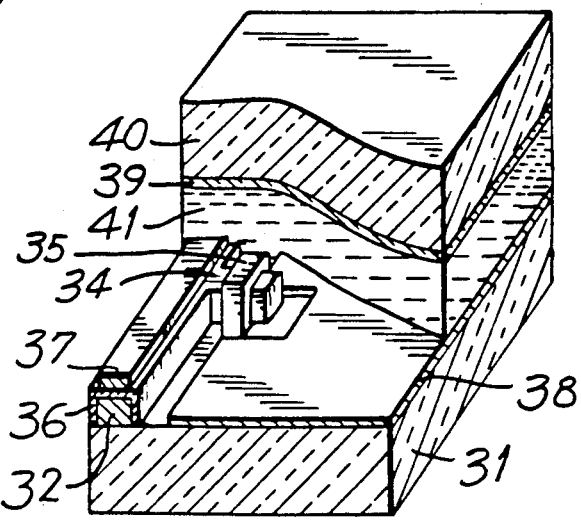
FIG. 12 is a perspective view partially cut away of a liquid crystal device in accordance with the invention.

FIG. 12 shows one pixel of a TN type liquid crystal display device utilizing an active matrix panel with low interpixel resistance constructed and arranged in accordance with the invention. First metal film 32 of Ta with a plurality of projection portions 34 is formed on an insulating 31. An insulating film 36 of TaO is formed on first metal film 32. A second metal film 37 of chromium is formed on first metal film 32 and a portion 35 overlaps corresponding projecting portion 34. A transparent picture element electrode 38 is deposited adjacent to first metal film 32 and overlaps the ends of second metal film portions 35 for providing electrical contact thereto. A second substrate 40 with a transparent electrode 39 thereon for cooperating with picture element electrode 38 is placed opposite substrate 31 and a liquid crystal material 41 is placed in the space between substrate 31 and 40.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all the generic and specific features of the invention herein described and all statements of the scope of the invention which, as a matter of language, might be said to fall therebetween.

What is claimed is:

1. An active matrix substrate for a liquid crystal display device, comprising
   a substrate;
   a matrix of picture element electrodes arranged in columns and rows on the substrate;
   a plurality of parallel line electrodes formed from a first metal layer deposited on the substrate and associated with a column or row of picture element electrodes, the line electrodes having a terminal portion for applying signals thereto and projecting pixel portions extending from the line electrode towards the picture element electrodes;
   a non-linear element associated with each picture element electrode for electrically connecting the picture element electrode to an associated line electrode;
   an insulation film formed on the first metal layer of the parallel line electrodes including the projecting portions; and
   a second metal layer formed on the insulation film of the parallel line electrodes and an isolated portion of the second metal layer on the projecting portions, the isolated portions directly connected to the picture element electrodes, the isolated portions of the second metal electrode, insulation film and projecting pixel portion of the first metal layer forming the non-linear element;
   the elements of the line electrode, insulating film and second metal layer forming an equivalent circuit which includes a capacitor connected in series between the terminal portion of the line electrode and each non-linear element.

2. The active matrix substrate of claim 1, wherein the non-linear element is a meal-insulator-metal device (MIM) including:
   a first metal layer on the substrate extending from the line electrode;
   an insulator film on a portion of the first metal extending from the line electrode; and
   a second metal layer disposed on a portion of the insulation layer and contacting the picture element electrode.

3. The active matrix substrate of claim 2, wherein the second metal layer has a resistivity less than the first metal layer.

4. The active matrix substrate of claim 3, wherein the first metal layer is Ta and the second metal is Cr.

5. The active matrix substrate of claim 2, wherein the first metal layer of the non-linear MIM element is the same as the first metal layer of the line electrode an the second metal layer of the MIM device is the same as the second metal layer on the line electrode.

6. The active matrix substrate of claim 5, wherein the first metal layers are tantalum, and the second metal of the line electrode is chromium.

7. A liquid crystal display device comprising:
   a substrate;
   a matrix of picture element electrodes arranged in columns and rows on the substrate;
   a plurality of parallel line electrodes formed from a first metal layer deposited on the substrate and associated with a column or row of picture element electrodes, the line electrodes having a terminal portion for applying signals thereto and projecting pixel portions extending from the line electrode towards the picture element electrodes;
   a non-linear element associated with each picture element electrode for electrically connecting the picture element electrode to an associated line electrode;
   an insulation film formed on the first metal layer of the parallel line electrodes including the projecting portions; and
   a second metal layer formed on the insulation film of the parallel line electrodes and an isolated portion of the second metal layer on the projecting portions, the isolated portions directly connected to the picture element electrodes, the isolated portions of the second metal electrode, insulation film and projecting pixel portion of the first metal layer forming the non-linear element;
   the element of the line electrode, insulating film and second metal layer forming an equivalent circuit which includes a capacitor connected in series between the terminal portion of the line electrode and each non-linear element;
   a second cooperating substrate having a plurality of spaced apart common electrodes for position opposite to a column or row of picture element electrodes on the first substrate, the electrodes on the second substrate formed so as to be perpendicular to the line electrodes on the first substrate; and
   a liquid crystal material interposed between the first and second substrates.

8. The liquid crystal display device of claim 7, wherein the non-linear elements include:
   a first metal layer on the substrate extending from the line electrode;
   an insulator film on a portion of the first metal extending from the line electrode; and
   a second metal layer disposed on a portion of the insulation layer and contacting the picture element electrode.

9. The liquid crystal display device of claim 8, wherein the second metal layer has a resistivity less than the first metal layer.

10. The liquid crystal display device of claim 9, wherein the first metal layer is Ta and the second metal is Cr.

11. The liquid crystal display device of claim 8, wherein the first metal layer of the non-linear MIM element is the same as the first metal layer of the line electrode and the second metal layer of the MIM device is the same as the second metal layer on the line electrode.

12. The liquid crystal display device of claim 11, wherein the first metal layers are tantalum, and the second metal of the line electrode is chromium.

* * * * *